United States Patent

[11] 3,600,699

[72] Inventor Arthur Orenberg
Lexington, Mass.
[21] Appl. No. 851,995
[22] Filed Aug. 21, 1969
[45] Patented Aug. 17, 1971
[73] Assignee RCA Corporation

[54] FREQUENCY SYNTHESIZER HAVING A PLURALITY OF CASCADED PHASE LOCKED LOOPS
9 Claims, 1 Drawing Fig.

[52] U.S. Cl. .......... 331/2, 331/22, 331/18, 331/25
[51] Int. Cl. .......... H03b 3/04
[50] Field of Search .......... 331/2, 18, 25, 22

[56] References Cited
UNITED STATES PATENTS

| | | | |
|---|---|---|---|
| 2,957,144 | 10/1960 | Huhn | 331/40 |
| 3,202,930 | 8/1965 | Muraszko | 331/2 |
| 3,283,260 | 11/1966 | Vaughan | 331/2 |

*Primary Examiner*—Roy Lake
*Assistant Examiner*—Siegfried H. Grimm
*Attorney*—E. J. Norton

ABSTRACT: A frequency synthesizer is disclosed which can provide a signal having any frequency between DC and 1 megahertz in 1 hertz steps. The synthesizer has six decades each of which determines one digit in the six digit number representing the output frequency. Each decade is a phase locked loop and includes a voltage controlled oscillator, a mixer, a variable N network and a phase comparator the output of which determines the frequency of the oscillator. The ÷N network in each decade is setable over a range of only 10 numbers N, the output of the N network being applied as one input to the phase comparator. A signal is fed from the mixer to the N network having a frequency which is equal to the difference between the frequency of the oscillator in the loop including the mixer and one-tenth of the oscillator frequency of the preceding loop.

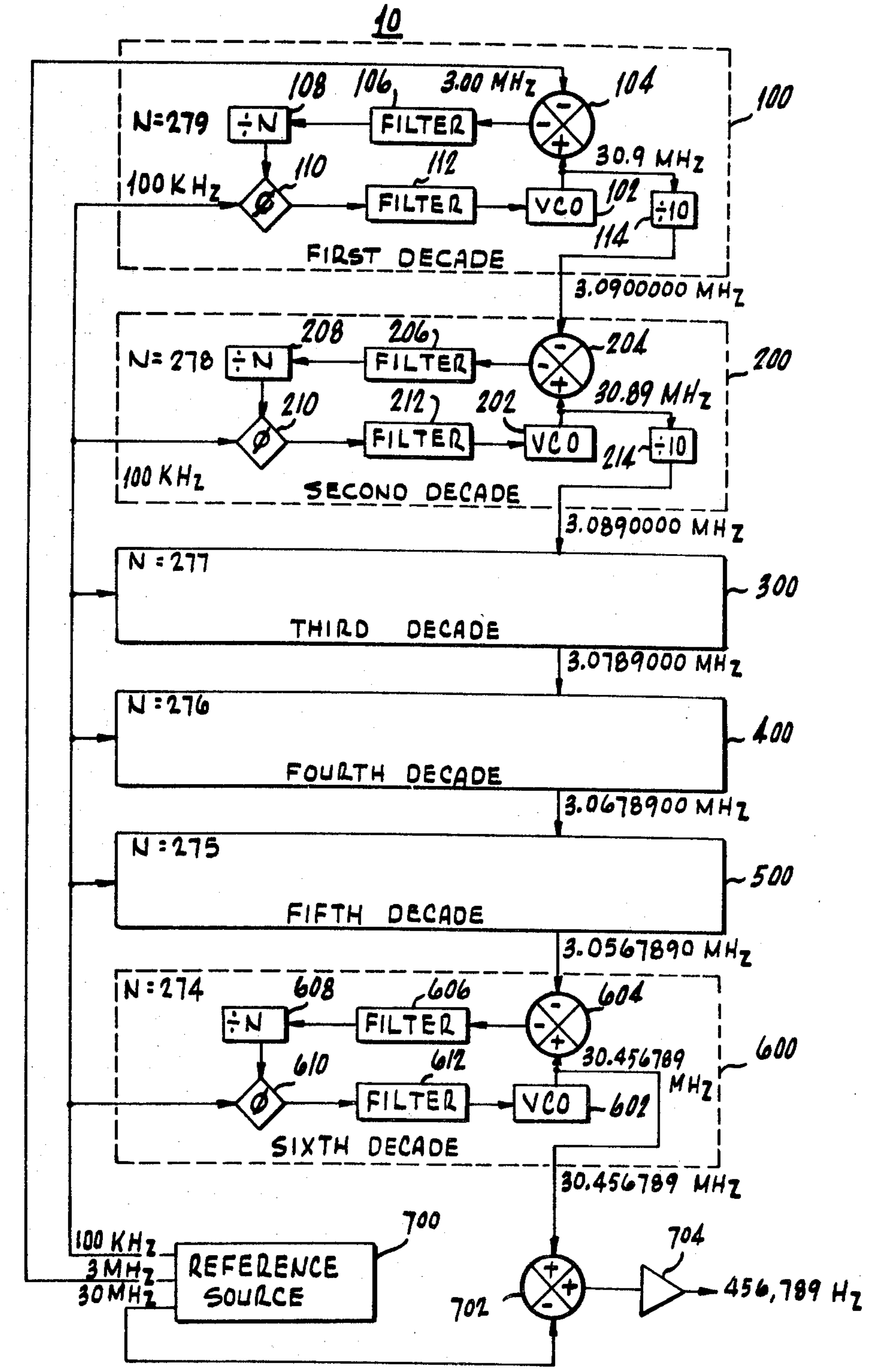
INVENTOR.
ARTHUR ORENBERG
BY Harry W Barron
ATTORNEY

FREQUENCY SYNTHESIZER HAVING A PLURALITY OF CASCADED PHASE LOCKED LOOPS

This invention relates to frequency synthesis and more particularly, to a circuit in which any frequency between DC and some given frequency may be obtained in small discrete steps.

In digital frequency synthesizers which utilize a phase locked loop to control the output frequency of a voltage control oscillator (VCO), one of the main problems is how to correct the frequency of the VCO at a rapid enough rate without limiting the channel space between available frequencies therefrom.

A normal phase locked loop includes a VCO oscillating at some frequency. The output of the VCO is applied to a setable ÷N network which divides the frequency of the VCO signal by a certain amount. The output of the N network is applied to one input of a phase comparing network and a signal having a certain reference frequency is applied to the other input of the phase comparing network. The output of the phase comparing network is a DC (direct current) voltage which changes proportionally by the amount that the phase of the output signal from the N network changes compared with the phase of the reference frequency signal. The output of the phase comparing network is applied back to the VCO as a DC signal and this signal biases a varactor in the VCO which, in turn, causes the VCO to change frequencies. Eventually, the loop becomes phase locked which is defined for the prior art system to be when the output frequency of the VCO is exactly N times the reference frequency. At this VCO frequency, the output of the phase comparator circuit is a constant DC signal.

One problem with such a system is that the channel spacing of the available frequencies provided by the VCO is limited by the reference frequency. Thus, where a very narrow channel spacing is desired, a very low reference frequency is necessary. However, this means that the VCO signal can only be corrected at a very low rate and there is a loss of the spectral purity in the output signal of the VCO.

In other words, if one desired a synthesizer to provide any frequency up to 1 megahertz in 1 hertz steps, the reference frequency would have to be 1 hertz. In this case, the 1 megahertz signal would be corrected one time for each one million cycles. This clearly is insufficient correction to maintain the output frequency relatively constant. Also, with this low spectral purity, it would require several seconds before the loop becomes locked.

Various approaches have been devised for overcoming this problem, and in most of them, multiple loop circuits are used such that a single VCO receives a DC bias from more than one loop. These approaches although successful in increasing the spectral purity without decreasing the channel spacing, are still limited as to the amount by which they can reduce the channel spacing. Another problem encountered in the prior art systems as described is that the VCO must be tuneable over six orders of magnitude (i.e., 1 Hz. to 1 MHz.). This requires several different oscillators and thus, complicated switching circuits must be included for switching in the proper oscillator.

It is an object of this invention to provide a simple and improved frequency synthesizer having a very small channel spacing.

The frequency synthesizer includes at least two phase locked loops each of which includes a voltage controlled oscillator VCO. The first of these loops is arranged in such a manner that the oscillator therein provides a signal having a frequency equal to a first predetermined frequency plus the frequency of a reference signal applied to that loop. The second loop is arranged so that the oscillator therein provides a signal having a frequency equal to a second predetermined frequency plus a frequency dependent upon the frequency of the oscillator in the first loop.

The invention can be better understood when reference is made to the single FIGURE of the drawing, in which an embodiment of a digital frequency synthesizer, as taught by this invention, is shown.

A digital frequency synthesizer 10 is shown which includes six identical frequency decades, 100, 200, 300, 400, 500, and 600. There is also a suitable reference source 700 which provides three signals having respective frequencies of 30 MHz, 3 MHz, and 100 kHz.

Referring now to the first decade 100, there is provided therein, a voltage controlled oscillator 102 of conventional design. Such an oscillator provides an output signal having a frequency dependent upon a DC voltage applied to an input thereof. VCO 102 is designed so that it can provide any signal having a frequency between 30.000000 MHz. and 30.999999 MHz. The output of VCO 102 is applied to one input of mixer circuit 104 of conventional design. The 3 MHz. reference signal is applied from the reference source 700 to the second input of the mixer 104. The output of mixer circuit 104 is a signal having a frequency equal to the difference between the frequencies of the two signals applied to the inputs thereof, or in other words, a signal between 27.000000 MHz. and 27.999999 MHz.

The output of mixer 104 is applied through a filter 106, which filters out any frequency other than those between 27 MHz and 28 MHz to the input of a variable N net work 108 which can be set to have any whole number divisor between 270 and 279. The output of N network 108 is applied to one input of a phase comparator 110, and the 100 kHz. reference signal is applied from the reference source 700 to the other input of the phase comparator 110. Phase comparator 110 is a well-known circuit which provides a DC signal at its output which changes as the phase relationship of the two signals applied to its inputs changes. The output of phase comparator 110 is applied through a low pass filter 112 to the input of VCO 102. The output of VCO 102 is also applied through a fixed 10 network 114 to the next decade. Fixed 10 network 114 divides the frequency applied to the input thereof by 10.

If N network 108 is set, for example, at 279, VCO 102 must oscillate at a frequency equal to 30.900000 MHz. in order for the loop to be phase locked. In other words, when the DC signal applied to the input of VCO 102 causes it to oscillate at this frequency, a 30.9 MHz. signal and the 3.00 MHz. reference signal are applied to the two inputs of mixer 104; thus, the output frequency of mixer 104 will be 27.9 MHz. (30.9-3.0). When this is divided by 279, the output of N network will be 100 kHz. which is equal to the reference frequency applied to the other input of phase comparator 110. Thus, the output of the phase comparator 110 will be a stabilized DC voltage, and first decade 100 is phase locked. Thus, for decade 100 to be phase locked, VCO 102 must oscillate at a frequency equal to N times the reference frequency applied to phase comparator 110 plus the frequency of the signal applied to the second input of mixer circuit 104, that is at $(279\times10^5)+3\times10^6=30.9$ MHz.

A second decade, 200, is provided which is identical to the first decade 100 except that instead of a 3.00 MHz. reference frequency being applied to the second input of mixer 204, the output of fixed 10 circuit 114 is applied thereto. If we assume divisor N is set at 278 in N network 208 in second decade 200, and that the output of fixed 10 network is a signal having a frequency of 3.09 MHz., VCO 202 must provide a signal having a frequency equal to 30.890000 MHz. in order for the loop to be phase locked. Thus, if VCO 202 oscillates at 30.89 MHz. and the second input to mixer 204 has a frequency of 3.09 MHz. then the output of mixer 204 will have a frequency equal to 27.8 MHz. (30.89-3.09). When this is divided by 278, the output of N network 208 is 100 kHz. and thus, the output of phase comparator 210 is stabilized DC voltage. The output of VCO 202 is also applied to the input of fixed 10 network 214, which divides the 30.89 MHz. signal of VCO 202 by 10. The output of fixed 10 network 214 is applied to the second input of a mixer circuit (not shown) in third decade loop 300.

This same procedure continues through the third, fourth, and fifth decades 300, 400, and 500 such that if the N networks in the decades are respectively set to have divisors N=277, N=276, and N =275, the output of the VCO in the fifth decade will be equal to 30.567890 MHz, which when divided by 10 by the 10 network in the decade 500 provides an output frequency from the fifth decade 500 of 3.0567890 MHz. The output of the fifth decade 500 is applied to the second input of mixer circuit 604 in the sixth decade 600. If N network 608 is set at N=274, analysis similar to that given above will show that VCO 602 will oscillate at a frequency equal to 30.456789 MHz.

The output of VCO 602 is applied directly to one input of a mixer circuit 702. The 30 MHz. reference signal is applied from the reference source to the other input of mixer circuit 702 and a signal having a frequency equal to the difference of these two input frequencies appears at the output of mixer 702. The output of mixer 702 is amplified and filtered by circuit 704 and the output of circuit 704 is the output of the synthesizer. Circuit 704 may also include an amplitude leveller circuit. Thus, in the example just given, the output frequency of synthesizer 10 is 456,789 Hz. (30.456789–30.000000).

If one desired a different frequency, say 456,788 Hz. it would merely be necessary to change N network 108 from 279 to 278. Thus, it is possible to obtain any frequency in 1 hertz steps between DC and 1 MHz. merely by setting the N networks, such as 108 and 208, in each decade 100, 200, 300, 400, 500 and 600 to the respective positions, in such a manner that N network 104 in first decade 100 controls the least significant digit, N network 204 in second 200 controls the next-least significant digit, and so forth until N network 604 in sixth decade 600 controls the most significant digit.

It is also possible with one minor addition to synthesizer 10 to obtain frequencies at the output of circuit 704 between DC and 30 MHz. In order to do this, the 30 MHz. reference signal from the source 700 is made variable in 1 MHz. steps between 1 MHz. and 30 MHz. Similarly, one may increase the frequency at the output of circuit 704 to say, 50 MHz., by merely having the VCO's such as 102, 202, and 602, in each decade 100, 200, 300, 400, 500 and 600 oscillate between 50 MHz. and 51 MHz. and the various N network, such as 108, 208 and 608 in each decade 100, 200, 300, 400, 500 and 600 be adjusted between 450 and 459. Also, it would be necessary to have the 3.00 MHz. reference signals be equal to a 5.00 MHz. reference signal and the 30 MHz. reference signal be made variable, in 1 MHz. steps, between 1 MHz. and 50 MHz.

Thus, in this synthesizer just described, the channel spacing is only 1 hertz, and this channel spacing is entirely independent of the frequency of the reference signals. In fact, the channel spacing can be made much smaller by merely adding more decades. For instance, if it was desired to have a frequency accurate to 0.01 hertz, then a seventh and an eighth decade would be necessary. In any event, all internal correction is always made at the 100 kHz. rate and the VCO's only oscillate over a 1 megahertz range, such as from 30 MHz to 31 Mhz.

What I claim is:

1. A digital frequency synthesizer, comprising:

means providing a signal having a reference frequency;

a first phase locked loop which includes a first controlled oscillator, said loop being responsive to the application thereto of a signal having a frequency dependent upon said reference frequency in such a manner that said first oscillator provides a signal having a frequency equal to a first predetermined frequency plus said frequency dependent upon said reference frequency;

a second phase locked loop which includes a second controlled oscillator, said second loop being responsive to the application thereto of a signal having a frequency which is dependent upon the frequency of said first oscillator such that said second oscillator provides a signal having a frequency equal to a second predetermined frequency plus said frequency dependent upon the frequency of said first oscillator; and said first and second phase locked loops further including;

a. a frequency dividing network having a divisor associated therewith and being responsive to the application thereto of a signal dependent upon the signal provided by the oscillator in that loop, said network providing a signal at an output thereof having a frequency which is a submultiple of said signal applied thereto, and b. a comparator circuit, responsive to the application thereto of said dividing network output signal and a signal having a frequency in fixed relationship with said reference frequency, for providing at an output thereof a signal dependent upon the phase changes between said signals applied thereto, said comparator circuit output signal being applied to said oscillator to control the frequency of the signal provided by said oscillator.

2. The invention according to claim 1:

wherein said first predetermined frequency is the product of the divisor of said dividing network in said first loop times the frequency of the signal applied to said comparator circuit which is in fixed relationship to said reference frequency; and wherein said second predetermined frequency is the product of the divisor of said dividing network in said second loop times the frequency of the signal applied inputs and an output, means for connecting said comparator circuit which is in fixed relationship with said reference frequency.

3. The invention according to claim 1:

wherein each of said loops further includes a mixer circuit having a first input to which the signal provided by said oscillator in that loop is applied, a second input to which a signal having a certain frequency is applied, and an output at which appears a signal having a frequency equal to the frequency difference between the signals applied to said first and second inputs thereof, said output being connected to said input of said dividing network in that loop; and wherein said signal having a frequency dependent upon reference frequency is applied to said second input of said mixer circuit included in said first loop and said signal having a frequency which is dependent upon the frequency of said first loop oscillator signal is applied to said second input of said mixer circuit included in said second loop.

4. The invention according to claim 1, wherein said synthesizer includes a third phased locked loop, which includes a third controlled oscillator, said third loop being responsive to the application thereto of a signal having a frequency dependent upon the frequency of said first oscillator output signal in such a manner that said third oscillator provides a signal having a frequency equal to a predetermined frequency associated with that loop plus a frequency dependent upon the frequency of said first oscillator output signal, the frequency of said second oscillator output signal being dependent upon said frequency of said third oscillator.

5. The invention according to claim 1 wherein said synthesizer further includes at least one mixer circuit having two inputs and an output, means for coupling said output of said second loop oscillator to the first input of said mixer, means for applying a signal having a frequency in fixed relationship with said reference frequency to the second input of said mixer, said mixer circuit providing a signal at said output thereof equal to the difference in the frequencies of the signals applied to said inputs thereof.

6. A frequency synthesizer for providing a signal having a desired frequency at an output thereof, said synthesizer comprising:

a signal source having a reference frequency;

first and second phase locked loops each of which includes at least, a controlled oscillator having an input and an output, said oscillator providing at said output signal having a frequency dependent upon a signal applied to said input thereof, a mixer circuit responsive to the application to a first input thereof of said oscillator output signal and to a second input thereof of a signal having a certain frequency to provide at an output thereof a signal having a frequency equal to the difference between the frequencies of the signals applied thereto, a frequency dividing network responsive to said mixer circuit output signal for providing to an output thereof a signal having a frequency which is a submultiple of said mixer circuit output signal frequency, a comparator circuit responsive to the application thereto of said dividing network output signal and a signal having a frequency in fixed relationship with said reference frequency, said comparator circuit providing at an output thereof a signal dependent upon the phase changes between said signals applied thereto;

means for applying the output of said comparative circuit to said input of said oscillator;

means coupled between said source and said second input of said mixer circuit in said first loop for applying to said first loop mixer circuit a signal having a frequency in fixed relationship to said reference frequency;

means coupled between the output of said oscillator in said first loop and said second input of said mixer circuit in said second loop for applying to said second loop mixer circuit a signal having a frequency in fixed relationship with said first loop oscillator output frequency; and means connecting said output of said oscillator in said second loop to said synthesizer output.

7. The invention according to claim 6, wherein said frequency dividing network can divide the frequency of the signal applied thereto by one of a plurality of preselected divisor values.

8. The invention according to claim 6 wherein said means connecting said oscillator in said second loop to said synthesizer output includes at least a further mixer circuit having two inputs and an output means for connecting said output of said oscillator in said second loop to the first input of said further mixer circuit, means for applying a signal having a frequency in fixed relationship with said reference frequency to the second input of said further mixer circuit, and means for connecting said output of said further mixer circuit to said synthesizer output, said further mixer circuit providing a signal at said output thereof having a frequency equal to the difference in the frequencies of the signals applied to said inputs thereof.

9. The invention according to claim 6 wherein said controlled oscillator is a voltage controlled oscillator and said comparator circuit provides a signal at its output having a certain voltage which changes whenever the phases of the signals applied to the inputs thereof change.

UNITED STATES PATENT OFFICE

CERTIFICATE OF CORRECTION

Patent No. 3,600,699 Dated August 17, 1971

Inventor(s) Arthur Orenberg

It is certified that error appears in the above-identified patent and that said Letters Patent are hereby corrected as shown below:

| | |
|---|---|
| Column 1, line 18 | "N" should be -- ÷N -- |
| Column 1, line 24 | "N" should be -- ÷N -- |
| Column 2, line 25 | "N" should be -- ÷N -- |
| Column 2, line 27 | "N" should be -- ÷N -- |
| Column 2, line 36 | "10" should be -- ÷10 -- |
| Column 2, line 38 | "N" should be -- ÷N -- |
| Column 2, line 45 | "N" should be -- ÷N -- |
| Column 2, line 53 | "105" should be -- $10^5$ -- |
| Column 2, line 58 | "10" should be -- ÷10 -- |
| Column 2, line 60 | "N" should be -- ÷N -- |
| Column 2, line 61 | "10" should be -- ÷10 -- |
| Column 2, line 68 | "N" should be -- ÷N -- |
| Column 2, line 70 | "10" should be -- ÷10 -- |
| Column 2, line 72 | "10" should be -- ÷10 -- |
| Column 2, line 75 | "N" should be -- ÷N -- |
| Column 3, line 4 | "10 network" should be -- ÷10 network -- |

UNITED STATES PATENT OFFICE

CERTIFICATE OF CORRECTION

Patent No. 3,600,699 Dated August 17, 1971

Inventor(s) Arthur Orenberg PAGE - 2

It is certified that error appears in the above-identified patent and that said Letters Patent are hereby corrected as shown below:

Column 3, line 7 "N" should be -- ÷N --

Column 3, line 23 "N" should be -- ÷N --

Column 3, line 25 "N" should be -- ÷N --

Column 3, line 28 "N" should be -- ÷N --

Column 3, line 29 "N" should be -- ÷N --

Column 3, line 30 "N" should be -- ÷N --

Column 3, line 41 "N" should be -- ÷N --

Signed and sealed this 25th day of April 1972.

(SEAL)
Attest:

EDWARD M.FLETCHER,JR.
Attesting Officer

ROBERT GOTTSCHALK
Commissioner of Patents